United States Patent
Lee

(10) Patent No.: US 11,088,218 B2
(45) Date of Patent: Aug. 10, 2021

(54) ELECTRIC PANEL AND ELECTRONIC DEVICE INCLUDING THE SAME

(71) Applicant: Samsung Display Co., Ltd., Yongin-Si (KR)

(72) Inventor: Sanghyun Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 164 days.

(21) Appl. No.: 16/164,747

(22) Filed: Oct. 18, 2018

(65) Prior Publication Data

US 2019/0165056 A1 May 30, 2019

(30) Foreign Application Priority Data

Nov. 27, 2017 (KR) .......................... 10-2017-0159672

(51) Int. Cl.
| | |
|---|---|
| *G06F 3/03* | (2006.01) |
| *H01L 27/32* | (2006.01) |
| *H04M 1/02* | (2006.01) |
| *G06K 9/00* | (2006.01) |
| *H01L 51/52* | (2006.01) |

(52) U.S. Cl.
CPC ........ *H01L 27/3227* (2013.01); *G06K 9/0004* (2013.01); *H01L 27/323* (2013.01); *H01L 27/3272* (2013.01); *H01L 51/5253* (2013.01); *H04M 1/026* (2013.01); *H04M 1/0266* (2013.01); *H04M 2250/12* (2013.01)

(58) Field of Classification Search
CPC .. G09G 3/3674; G09G 3/3677; G09G 3/3266; G09G 2310/0267; G09G 2310/08; G06F 3/044; G06F 3/0416; G06F 3/0304
See application file for complete search history.

(56) References Cited

U.S. PATENT DOCUMENTS

| | | | |
|---|---|---|---|
| 9,450,033 B2 | 9/2016 | Suh et al. | |
| 9,864,893 B2 | 1/2018 | Kim et al. | |
| 10,185,861 B2 | 1/2019 | Zeng et al. | |
| 2016/0350571 A1 | 12/2016 | Han et al. | |
| 2017/0017824 A1 | 1/2017 | Smith et al. | |
| 2017/0270342 A1 | 9/2017 | He et al. | |
| 2017/0293378 A1 | 10/2017 | Ahn et al. | |
| 2018/0011601 A1* | 1/2018 | Kurasawa | G06F 3/0412 |

(Continued)

FOREIGN PATENT DOCUMENTS

| | | |
|---|---|---|
| CN | 106981503 A | 7/2017 |
| KR | 10-2012-0080845 A | 7/2012 |

(Continued)

OTHER PUBLICATIONS

European search report corresponding to European Patent Application No. 18206920.3 dated Mar. 15, 2019 8 pages.

*Primary Examiner* — Dennis P Joseph
(74) *Attorney, Agent, or Firm* — Innovation Counsel LLP

(57) ABSTRACT

Provided is an electronic device including: a display panel having a front surface and a rear surface that faces the front surface and including a plurality of light emitting areas each of which is disposed on the front surface and displays light, a light sensing module disposed on the rear surface and including a light detection element, and a lattice filter disposed between the display panel and the light sensing module, and including a plurality of light transmission parts arranged on the rear surface while being spaced apart from each other.

21 Claims, 13 Drawing Sheets

(56) References Cited

U.S. PATENT DOCUMENTS

| | | | | |
|---|---|---|---|---|
| 2018/0040675 A1* | 2/2018 | Zeng | .................... | G06K 9/0004 |
| 2018/0068160 A1* | 3/2018 | Wu | .................... | G06K 9/00013 |
| 2018/0129798 A1* | 5/2018 | He | ....................... | G06K 9/0002 |

FOREIGN PATENT DOCUMENTS

| KR | 10-1376227 B1 | 3/2014 |
|---|---|---|
| KR | 10-2014-0136216 A | 11/2014 |
| KR | 10-2016-0141180 A | 12/2016 |
| KR | 10-2017-0116319 A | 10/2017 |

\* cited by examiner

ELECTRIC PANEL AND ELECTRONIC DEVICE INCLUDING THE SAME

CROSS-REFERENCE TO RELATED APPLICATIONS

This U.S. non-provisional patent application claims priority, under 35 U.S.C. § 119, from Korean Patent Application No. 10-2017-0159672 that was filed on Nov. 27, 2017, the entire contents of which are hereby incorporated by reference.

BACKGROUND

The present disclosure herein relates to an electronic panel and an electronic device including the same, and more particularly, to an electronic panel having the improved optical sensitivity and an electronic device including the same.

Electronic devices provide various functions enabling the intimate communication with a user, such as the display of an image to provide information to a user, or detection of an input from a user.

In addition, recent electronic devices also have the function of detecting a fingerprint of the user. The methods for identifying the fingerprint include a capacitive type method based on the capacitance change of a capacitor provided between electrodes, an optical type method using an optical system, and an ultrasonic type method utilizing a piezoelectric body.

In the fingerprint identification done by the optical type method, the fingerprint is detected using the light quantity provided from the optical sensor. Thus, the fingerprint identification sensitivity may be influenced by the light quantity that reaches the optical sensor. Accordingly, various technologies have been suggested to ensure that the desired light quantity reaches the optical sensor.

SUMMARY

The present disclosure provides an electronic panel capable of stably providing the proper quantity of light for easily detecting a fingerprint, to a light sensing module. Also, the present invention also provides an electronic device having the improved fingerprint sensitivity.

An embodiment of the inventive concept provides an electronic device including: a display panel having a front surface and a rear surface that faces the front surface, and including a plurality of light emitting areas each of which is disposed on the front surface and displays light; a light sensing module disposed on the rear surface and including a light detection element; and a lattice filter disposed between the display panel and the light sensing module, and including a plurality of light transmission parts arranged on the rear surface while being spaced apart from each other.

In an embodiment, light incident to the light sensing module may be incident through the light transmission parts.

In an embodiment, the light incident to the light sensing module may have an optical path controlled in a direction parallel to a thickness direction of the display panel.

In an embodiment, the lattice filter may have a light blocking material.

In an embodiment, the lattice filter may have silver (Ag).

In an embodiment, the display panel may further include a cover layer that covers the rear surface of the display panel and has an organic material, and the lattice filter may contact the cover layer.

In an embodiment, the cover layer may have a rear surface having a plurality of prominence and depression portions, and the lattice filter may be disposed along the prominence and depression portions.

In an embodiment, the display panel may have a fingerprint detection area which overlaps at least a portion of the light emitting areas and on which a fingerprint of a user is detected, and the light transmission parts of the lattice filter may overlap the fingerprint detection area on a plane.

In an embodiment, the lattice filter entirely may cover the rear surface of the display panel, and the light transmission parts may be defined on a portion of the lattice filter.

In an embodiment, the lattice filter may entirely cover the rear surface of the display panel, and the light transmission parts may be defined over an entirety of the lattice filter.

In an embodiment, the lattice filter may have a rear surface that faces the light sensing module and has a plurality of prominence and depression portions.

In an embodiment, the lattice filter may include: an adhesive part that has an adhesive material; and a lattice part that contacts the adhesive part and includes the light transmission parts defined therein.

In an embodiment, the adhesive part may contact both the display panel and the light sensing module, and may couple the display panel and the light sensing module.

In an embodiment, the lattice part may be disposed between the adhesive part and the light sensing module, and portions of the adhesive part may contact the light sensing module through the light transmission parts.

In an embodiment, the display member may include: an array part that includes a plurality of thin film elements; and a plurality of organic light emitting elements that are electrically connected to the array part and disposed in the respective light emitting areas.

In an embodiment, the electronic device may further include a input sensing part that is disposed on the display panel and detects a touch applied from the outside.

In an embodiment, the light detection element may include a first electrode, a second electrode facing the first electrode, and a light detection layer that is disposed between the first electrode and the second electrode and has a light reactive semiconductor material.

In an embodiment of the inventive concept, an electronic panel includes: a display panel having a display area that displays an image and a peripheral area that is adjacent to the display area, the display panel including a plurality of organic light emitting elements disposed in the display area; and a lattice filter that contacts the rear surface and includes a plurality of through-parts arranged on the rear surface while being spaced apart from each other in a matrix form, wherein the through-parts overlap at least a portion of the display area.

In an embodiment, at least a portion of light discharged from the organic light emitting elements may pass through the rear surface of the display panel and penetrates the through-parts.

In an embodiment, the lattice filter may cover an entirety of the rear surface of the display panel.

In an embodiment, the lattice filter may have an organic material.

In an embodiment, a rear surface of the lattice filter may be an uneven surface.

In an embodiment, the rear surface of the display panel may be an uneven surface having a plurality of prominence and depression portions, and the lattice filter is disposed along the prominence and depression portions.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, an electronic device according to an embodiment of the inventive concept will be described with reference to the drawings.

Figure 1:
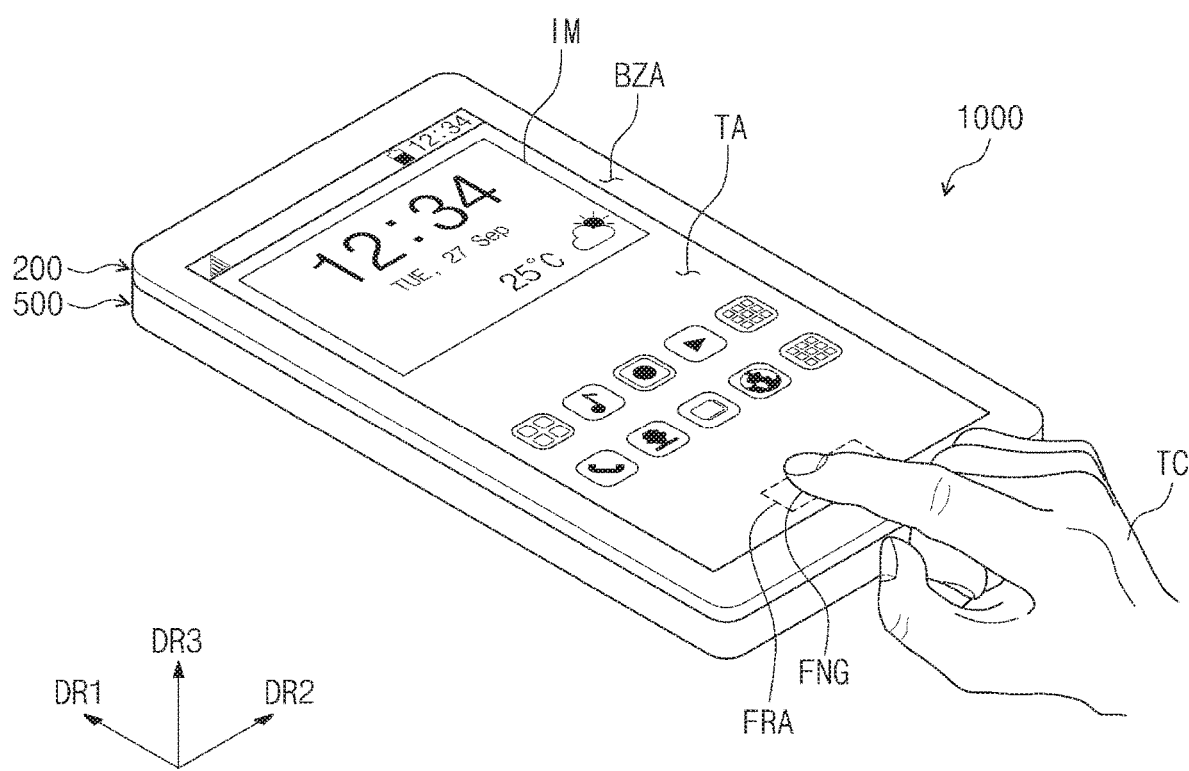
FIG. 1 is a perspective view illustrating a state in which an electronic device according to an embodiment of the inventive concept is assembled.
Figure 2:
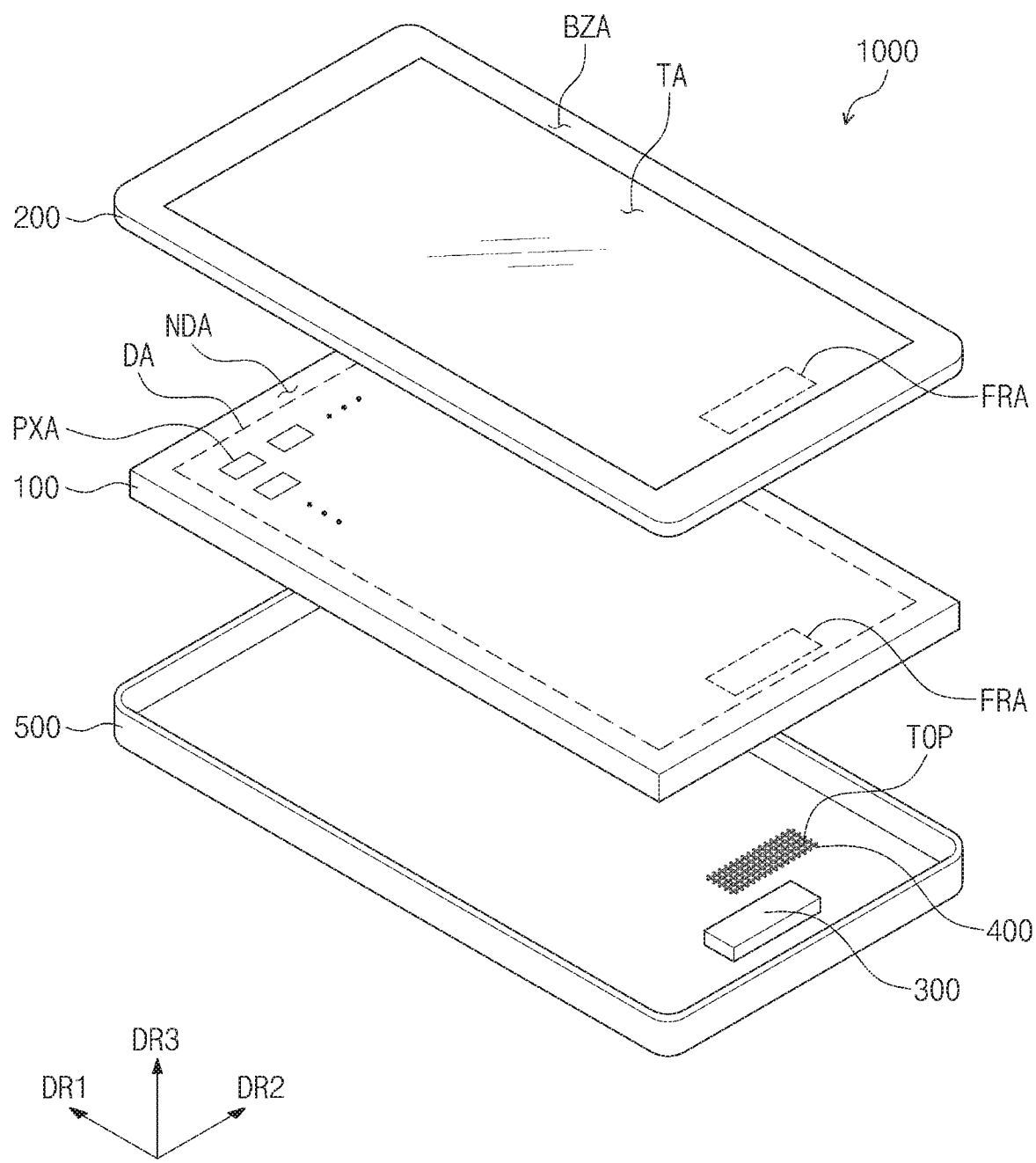
FIG. 2 is an exploded perspective view of the electronic device of FIG. 1.
Figure 3:
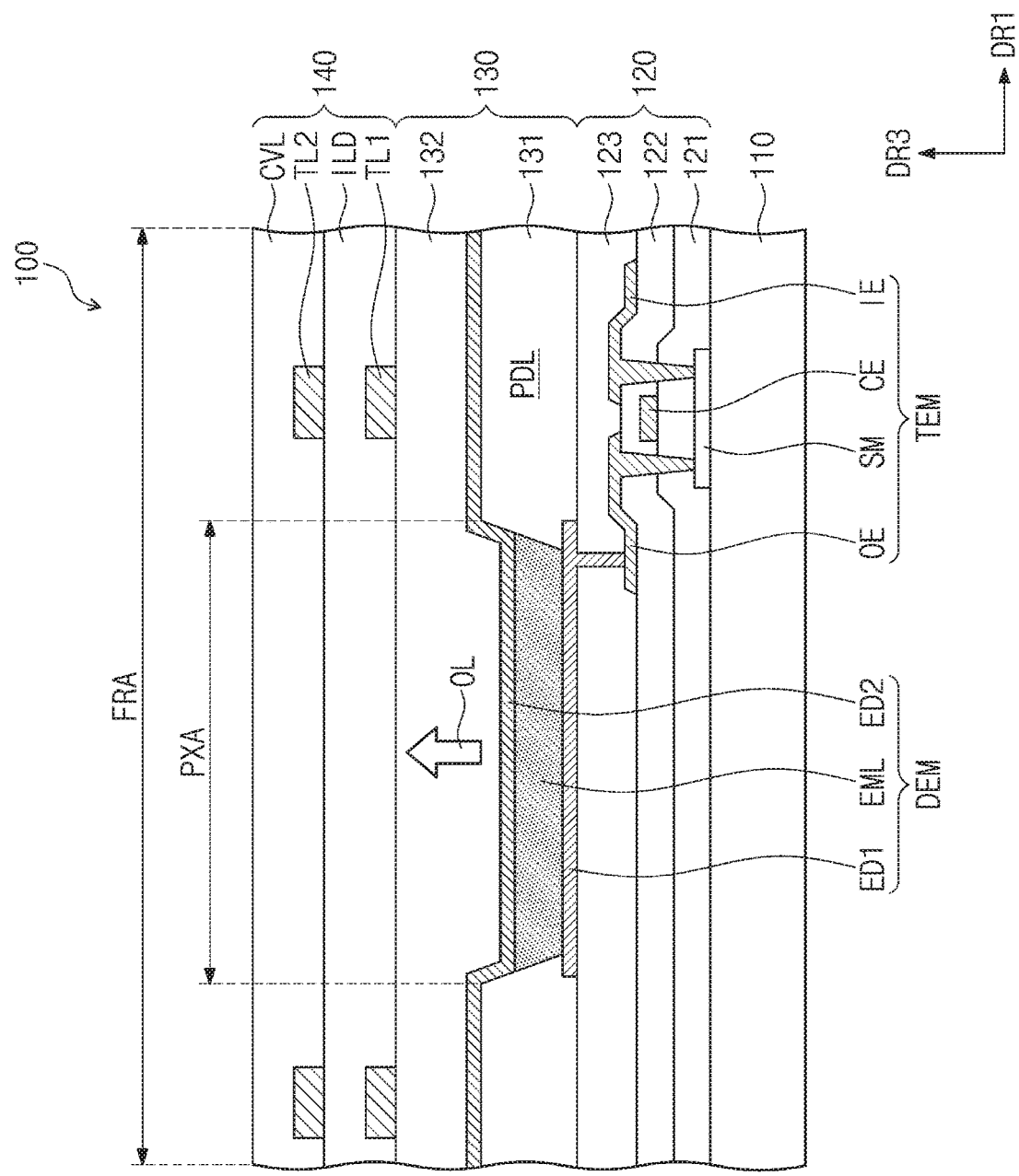
FIG. 3 is a cross-sectional view illustrating a portion of a partial configuration shown in FIG. 2.

FIG. 1 is a perspective view illustrating a state in which an electronic device according to an embodiment of the inventive concept is assembled. FIG. 2 is an exploded perspective view of the electronic device of FIG. 1. FIG. 3 is a cross-sectional view illustrating a portion of a partial configuration shown in FIG. 2. In FIG. 2, portions of the configuration are omitted for ease of description. Hereinafter, an embodiment of the inventive concept will be described with reference to FIGS. 1 to 3.

An electronic device 1000 may be a device which may be activated in response to an electrical signal. The electronic device 1000 may include various embodiments. For example, the electronic device 1000 may include a tablet, a laptop, a computer, and a smart television. In the current embodiment, a configuration in which the electronic device 1000 is a smart phone is illustrated as an example.

The electronic device 1000 may have a hexahedral shape that has the thickness in a third direction DR3 that is orthogonal to a plane defined by first and second direction DR1 and DR2, the first direction DR1 and the second direction DR2 being perpendicular to each other. However, this is merely an example, and the electronic device 1000 may have any of various shapes other than the embodiment shown.

The front surface of the electronic device 1000 may be parallel to a plane that is defined by the first direction DR1 and the second direction DR2, and display an image IM in the third direction DR3. A display surface on which the image is displayed may correspond to a front surface of the electronic device 1000.

The front surface of the electronic device 1000 may be divided into a transmission area TA and a bezel area BZA. The transmission area TA may be an area on which the image IM is displayed. The image IM may be viewed through the transmission area TA by the user.

The bezel area BZA is adjacent to the transmission area TA. The bezel area BZA may have a predetermined color. A shape of the transmission area TA may be defined substantially by the bezel area BZA.

In the current embodiment, a front surface (or a top surface) and a rear surface (or a bottom surface) for each member are defined with respect to the direction in which the image IM is displayed. The front and rear surfaces face each other in the third direction DR, and normal directions of both the front and rear surfaces may be parallel to the third direction DR3.

Here, directions that are indicated as the first to third directions DR1, DR2, and DR3 may have a relative concept and may be thus changed to other directions. Hereinafter, first to third directions refer to the same reference symbols as the directions indicated by the first and third directions DR1, DR2, and DR3, respectively.

The electronic device 1000 may detect a touch TC applied from the outside. The touch TC may include various types of inputs provided from the outside of the electronic device 1000. For example, the touch TC includes various types of external inputs such as a portion of user's body, light, heat, pressure, or the like. Also, the electronic device 1000 may detect a touch TC that comes into contact with the electronic device 1000, and also may detect a touch TC that is approaching or adjacent thereto.

The electronic device 1000 may detect a touch TC applied to the transmission area TA, and may not detect a touch TC applied to the bezel area BZA. Alternatively, the electronic device 1000 may detect a touch TC applied to the bezel area BZA, and may not detect a touch TC applied to the transmission area TA. Alternatively, the electronic device 1000 may detect a touch TC applied to the front surface of the electronic device 1000 that includes the transmission area TA and the bezel area BZA. The electronic device 1000 according to an embodiment of the inventive concept may detect a touch TC applied to various regions depending on the design for internal configuration, and is not limited to one embodiment.

In FIG. 1, a configuration in which the touch TC is a hand that is a portion of a user's body is illustrated as an example.

However, this is merely an example, and the electronic device according to an embodiment of the inventive concept may detect various types of inputs, and is not limited to one embodiment.

In the current embodiment, the electronic device 1000 may detect a surface FNG of the touch TC. The surface FNG of the touch TC may include a surface condition such as the surface uniformity or the surface bent shape. When the touch TC is the hand of the user, the surface FNG of the touch TC may include fingerprint information. However, this is merely illustrated as an example, and the surface FNG of the touch TC may also include information of surface of non-conductor.

The information about the touch TC may include the information about the position at which the touch TC is provided and the intensity of the touch TC. The information about the surface of the touch TC (hereinafter, referred to as a fingerprint) may include the surface information about the touch TC that contacts the electronic device 1000. In the current embodiment, the information about the touch TC and the information about the fingerprint FNG may be detected independently.

The electronic device 1000 may provide a fingerprint detection area FRA, which detects the fingerprint FNG, to the front surface. In the current embodiment, the fingerprint detection area FRA may be provided in the transmission area TA. The electronic device 1000 may detect the surface information of the touch TC applied to the fingerprint detection area FRA.

FIGS. 1 and 2 illustrate that the fingerprint detection area FRA is provided in an area of the display area DA that is smaller than the entirety of the display area DA. However, these embodiments are merely examples and no intended to be limitations. In other embodiments, the fingerprint detection area FRA may not overlap the display area DA, or overlap the entirety of the display area DA.

The electronic device 1000 may include a display panel 100, a window member 200, a light sensing module 300, a lattice filter 400, and a housing member 500. The housing member 500, the light sensing module 300, the lattice filter 400, the display panel 100, and the window member 300 may be assembled while being stacked in the third direction DR3.

In FIG. 2, portions of the configuration are selectively illustrated for ease of description. The electronic device 1000 may further include various components such as a power supply module, an optical member, a protection member, a heat dissipation member, and an eclectic module including electronic elements, in addition to the display panel 100, the window member 200, the light sensing module 300, the lattice filter 400, and the housing member 500.

The display panel 100 may be divided into a display area DA and a peripheral area NDA. The display area DA may be an area on which the image IM is displayed. The display area DA includes a plurality of light emitting areas PXA that generate the image IM. The light emitting areas PXA are arranged on the display area DA while having a matrix form.

In FIG. 3, one light emitting area PXA is illustrated as an example. Here, FIG. 3 illustrates a portion of the fingerprint detection area FRA. The fingerprint detection area FRA includes at least one light emitting area PXA. That is, the fingerprint detection area FRA may be provided in an area that overlaps the display area DA.

Referring to FIG. 3, the display panel 100 may include a base substrate 110, an array part 120, a display element part 130, and an input sensing part 140. The base substrate 110 may have the insulation properties. The base substrate 110 may be a base layer over which the array part 120, the display element part 130, and the input sensing part 140 are provided.

In the current embodiment, the base substrate 110 may be transparent. For example, the base substrate 110 may have a glass substrate, a plastic substrate, an insulation film, or a combination thereof.

The array part 120 is disposed on the base substrate 110. The array part 120 includes a thin film element TEM and a plurality of insulation layers. The insulation layers may have an inorganic material and/or an organic material. The insulation layers may include a first insulation layer 121, a second insulation layer 122, and a third insulation layer 123 successively stacked on each other in the third direction DR3.

The thin film element TEM may be a thin film transistor. Particularly, the thin film element TEM includes a semiconductor pattern SM, a control electrode CE, an input electrode IE, and an output electrode OE. The thin film element TEM controls a charge movement of the semiconductor pattern SM through the control electrode CE, and outputs an electrical signal, which is inputted from the input electrode IE, via the output electrode OE.

The first insulation layer 121 may be disposed between the semiconductor pattern SM and the control electrode CE. In the current embodiment, it is illustrated that the control electrode CE is disposed over the semiconductor pattern SM. However, this is merely an example, and the thin film element TEM according to an embodiment of the inventive concept may include a semiconductor pattern SL disposed on the control electrode CE and is not limited to one embodiment.

The second insulation layer 122 may be disposed between the control electrode CE and the input and output electrodes IE and OE. The input electrode IE and the output electrode OE may be disposed on the second insulation layer 122. The input and output electrodes IE and OE may pass through the first and second insulation layers 121 and 122 and contact the semiconductor pattern SM. However, this is merely an example, and the input electrode IE and the output electrode OD may directly contact the semiconductor pattern SM.

The third insulation layer 123 is disposed on the second insulation layer 122. The third insulation layer 123 may cover the thin film element TEM. The third insulation layer 123 makes the thin film element TEM insulated electrically from the display element layer 130.

However, this is illustrated as an example, and the thin film element TEM may be a capacitor. Here, the thin film element TEM may include two electrodes spaced apart from each other in the third direction DR3, while at least one of the first to third insulation layers 121, 122, and 123 are disposed between the two electrodes. Also, although not shown, the array part 120 may further include a plurality of signal lines that provide an electrical signal to the thin film element TEM. The array part 120 according to an embodiment of the inventive concept may include various thin film elements and the signal lines, and is not limited to one embodiment.

The display element part 130 includes a display element DEM and a plurality of insulation layers. In the current embodiment, the display element DEM may include various electronic elements that display light in response to an electrical signal. The display element DEM may be connected to the thin film element TEM. In the current embodiment, a configuration in which the display element DEM is an organic light emitting element will be described as an example.

The insulation layers may include a fourth insulation layer 131 and a fifth insulation layer 132. The fourth insulation layer 131 is disposed on the third insulation layer 123. In the fourth insulation layer 131, a plurality of light transmission parts may be defined. The display element DEM may be provided in each of light transmission parts. The light emitting areas PXA may be defined substantially by the light transmission parts. In the current embodiment, the fourth insulation layer 131 may correspond to a pixel definition layer.

The display element DEM includes a first electrode ED1, a second electrode ED2, and light emitting pattern EML. The display element DEM makes the excitation of the light emitting pattern EML through the voltage difference between the first electrode ED1 and the second electrode ED2.

The first electrode ED1 is disposed on the array part 120. The first electrode ED1 may pass through the third insulation layer 123 and thus be electrically connected to the thin film element TEM. The first electrode ED1 may be provided in plurality. At least portions of the plurality of the first electrodes may be exposed by the light transmission parts, respectively.

The second electrode ED2 is disposed over the first electrode ED1. The second electrode ED2 may have an integrated shape that overlaps the fourth insulation layer 131 and the plurality of the first electrodes. When the display element DEM is provided in plurality, the second electrode ED2 may have the same voltage for all the display elements. Accordingly, no additional patterning process is required to form the second electrode ED2. However, this is merely an example, and the second electrode ED2 may be provided in plurality so that there is one second electrode ED2 for each of the light transmission parts.

The light emitting pattern EML is disposed between the first electrode ED1 and the second electrode ED2. The light emitting pattern EML is provided in plurality, and may be disposed in each of the light transmission parts. The display element DEM activates the light emitting pattern EML in response to the voltage difference between the first electrode ED1 and the second electrode ED2, and may produce light OL.

In the current embodiment, the first electrode ED1 may have reflective properties. For example, the first electrode ED1 may include a metal with high reflectivity, and have a conductive pattern in which a front surface thereof is coated with a reflective layer.

On the other hand, the second electrode ED2 may be optically transparent. For example, the second electrode ED2 may have a transparent conductive oxide (TCO).

The display element DEM includes the first electrode ED1 with the reflective properties and the second electrode ED2 with the transparent properties, and thus may have a front-type light emitting structure. The light OL generated in the display element DEM passes through the second electrode ED2, and then may be provided toward the front surface. The light OL generated in the display element DEM makes the image IM. Also, the light OL generated in the display element DEM may be used as a light source for detecting the fingerprint FNG. This will be described later in detail.

Here, although not shown, the display element DEM may further include at least one organic layer. The organic layer may be disposed between the first electrode ED1 and the light emitting pattern EML and between the second electrode ED2 and the light emitting pattern EML. The organic layer controls the movement of electric charges that generate light in the light emitting pattern EML, and thus may improve the light emitting efficiency and lifespan of the display element DEM.

The fifth insulation layer 132 is disposed over the fourth insulation layer 131, and covers the display element DEM. The fifth insulation layer 132 may have the insulation properties. For example, the fifth insulation layer 132 may include at least one organic film and/or inorganic film. The fifth insulation layer 132 planarizes a top surface of the display element DEM, and prevents the display element DEM from being influenced by external moisture, pollution, or impact, thereby protecting the display element DEM.

The input sensing part 140 is disposed on the display element part 130. However, this is illustrated as an example, and the input sensing part 140 may be disposed under the display element part 130. The input sensing part 140 may be disposed in various positions, and is not limited to one embodiment.

The input sensing part 140 detects the touch TC illustrated in FIG. 1. The electronic device 1000 can obtain the information about the intensity and the position of the provided touch TC.

The input sensing part 140 may include a first detection layer TL1, an insulation layer ILD, a second detection layer TL2, and a cover layer CVL. The first detection layer TL1 and the second detection layer TL2 may cross each other while being insulated by the insulation layer ILD disposed therebetween. The touch detection layer 140 detects information about the touch TC, by using that an electric field created between the first detection layer TL1 and the second detection layer TL2 is changed due to the touch TC.

Each of the first insulation layer TL1 and the second insulation layer TL2 may include a plurality of mesh lines. Each of the mesh lines may be disposed so as not to overlap the light emitting area PXA. Accordingly, although the mesh lines include an opaque material, the light OL displayed on the light emitting area PXA is not affected thereby. However, this is merely described as an example, and a portion of the mesh lines may be disposed in the light emitting area PXA.

In some embodiments, the first detection layer TL1 and the second detection layer TL2 may be disposed on the same layer. In this case, the first detection layer TL1 and the second detection layer TL2 may include a plurality of sensor electrodes spaced apart from each other on a plane.

Alternatively, the first detection layer TL1 and the second detection layer TL2 may have transparent conductive materials. Here, the first detection layer TL1 and the second detection layer TL2 may be disposed while overlapping the light emitting area PXA. The input sensing part 140 according to an embodiment of the inventive concept may have various shapes, and is not limited to one embodiment.

The cover layer CVL is disposed on the second detection layer TL2 and covers the second detection layer TL2. The cover layer CVL may include at least one insulation film. The cover layer CVL may include an organic film and/or an inorganic film. Alternatively, in the input sensing part 140 according to an embodiment of the inventive concept, the cover layer CVL may be omitted. In this case, the cover layer CVL may be replaced by the window member 200.

In the display panel 100 according to an embodiment of the inventive concept, the input sensing part 140 may be omitted. Alternatively, the input sensing part 140 may be coupled to the display element layer 130 with an adhesive layer.

Referring back to FIGS. 1 and 2, the window member 200 is disposed on the front surface of the display panel 100. The window member 200 provides a front surface of the electronic device 1000, and protects the display panel 100. For example, the window member 200 may have a glass substrate, a sapphire substrate, or a plastic film. The window member 200 may have a multi-layered or a single-layered structure. For example, the window member 200 may have a stacked structure in which a plurality of plastic films are coupled by the adhesive, or a stacked structure in which the glass substrate is coupled to the plastic film by the adhesive.

The window member 200 defines the front surface of the electronic device 1000. The transmission area TA and the bezel area BZA may be included in the window member 200. The transmission area TA may be an optically transparent area. Transmission area TA transmits an area corresponding to the display area DA. For example, the transmission area TA overlaps the entire surface or at least a subportion of the display area DA. The image IM displayed on the display area DA of the display panel 100 may be visible through the transmission area TA.

The bezel area BZA defines a shape of the transmission area TA. The bezel area BZA may be adjacent to the transmission area TA, and may surround the transmission area TA. The bezel area BZA may have a predetermined color. The bezel area BZA covers the peripheral area NDA of the display panel 100, and thus may prevent the peripheral area NDA from being viewed from the outside. However, this is merely illustrated as an example, and the bezel area BZA may be omitted in the window member 200 according to an embodiment of the inventive concept.

The light sensing module 300 may be disposed on the bottom surface of the display panel 100. The light sensing module 300 is disposed on an area that overlaps the fingerprint detection area FRA on a plane.

The light sensing module 300 detects incident light and produces an electrical signal. The light that is incident on the light sensing module 300 may be the light OL generated from the display element DEM and reflected by the fingerprint FNG, which passes through the display panel 100, and is then discharged.

The electrical signal may correspond to quantity and intensity of the light incident on the light sensing module 300. The light sensing module 300 may produce an electrical signal, which has the fingerprint information of the user, through the incident light. This will be described later in detail.

The lattice filter 400 is disposed between the display panel 100 and the light sensing module 300. The lattice filter 400 may have a lattice shape that defines a plurality of light transmission parts TOP. Each of the light transmission parts TOP penetrates the lattice filter 400 in the third direction DR3.

The lattice filter 400 may have a light blocking material. For example, the lattice filter 400 may have an organic material with a light blocking color. The lattice filter 400 may have a material with the high optical reflectivity. For example, the lattice filter 400 may have a metal with high reflectivity.

The lattice filter 400 may filter light that travels from the display panel 100 to the light sensing module 300. The light, which passes through the lattice filter 400, has an optical path parallel to the third direction DR3, and may be radiated from the lattice filter 400. The light sensing module 300 has an optical path controlled to be parallel to the third direction DR3, and may receive light having a uniform optical path. Accordingly, the light sensing module 300 may have the optical sensitivity having the improved uniformity and accuracy. This will be described later in detail.

The housing member 500 is disposed on the bottom surface of the display panel 100. The housing member 500 is coupled to the window member 200, and may provide the bottom surface of the electronic device 1000. The housing member 500 is coupled to the window member 200, and defines internal space and accommodates the display panel 100 and the light sensing module 300 in the internal space.

Although not shown, the electronic device 1000 may further include additional components such as at least one circuit board, a power supply module for supplying power, a shock absorbing member for protecting internal components, and an optical member for improving the optical efficiency. These additional components may be accommodated in the housing member 500.

The housing member 500 may include a material having a relatively high rigidity. For example, the housing member 500 may include a plurality of frames and/or plates having glass, plastic, and metal. The housing member 500 may stably protect the components of the electronic device 1000, which are accommodated in the internal space, against external impacts.

According to an embodiment of the inventive concept, the electronic device 1000 further includes the lattice filter 400, and thus the fingerprint sensitivity through the light sensing module 300 may be improved. This will be described later in detail.

Figure 4A:
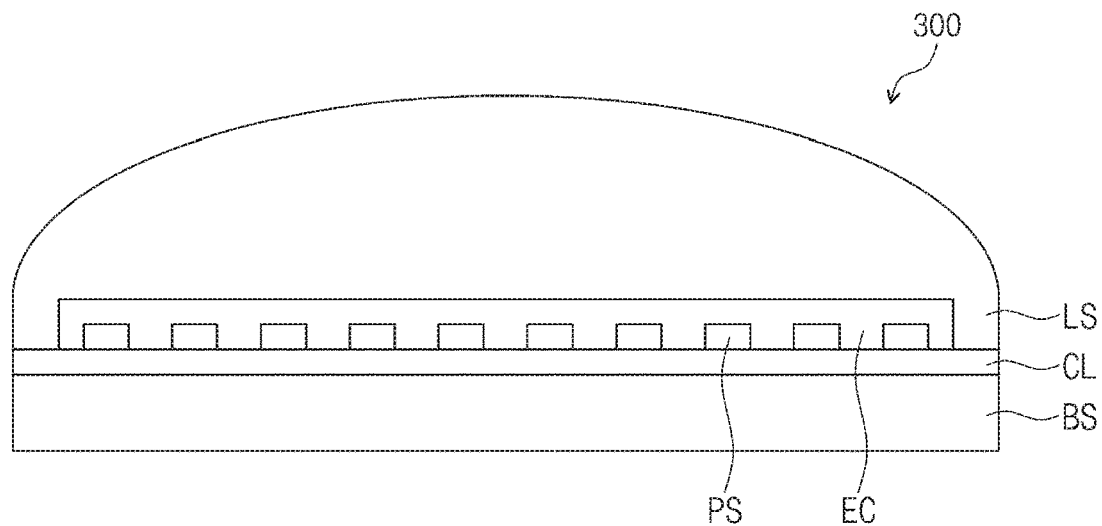
FIG. 4A is a cross-sectional view schematically illustrating a light sensing module according to an embodiment of the inventive concept.
Figure 4B:
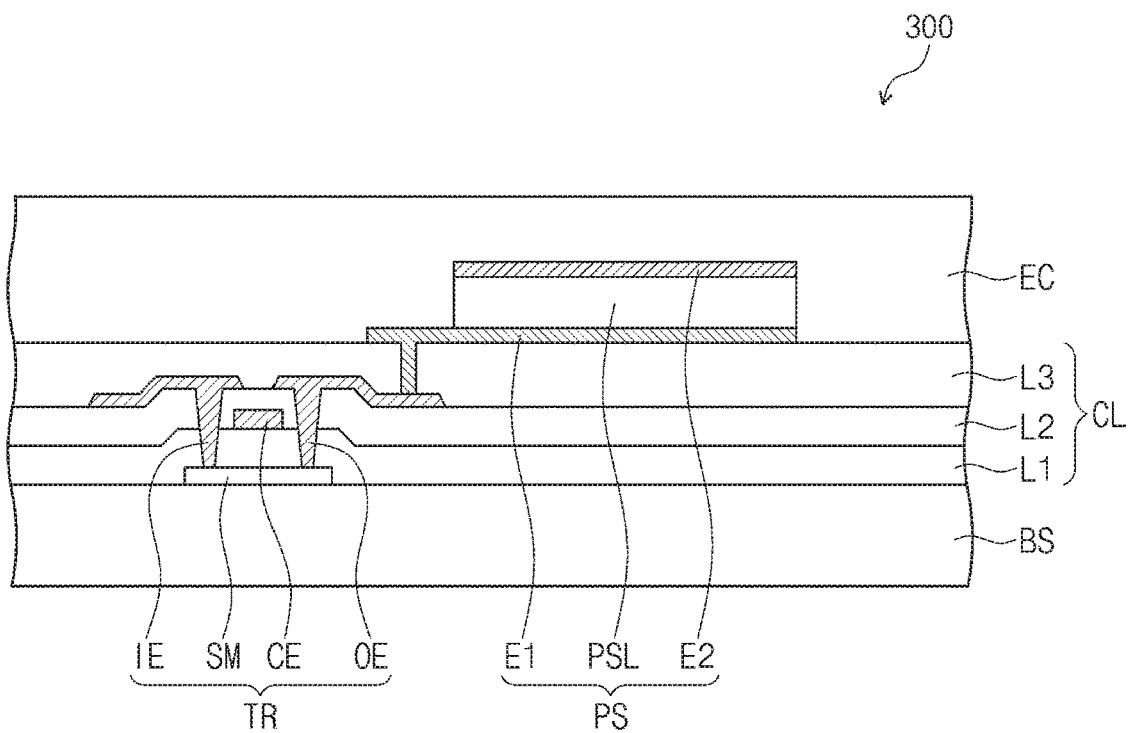
FIG. 4B is a cross-sectional view illustrating a portion of FIG. 4A.

FIG. 4A is a cross-sectional view schematically illustrating a light sensing module according to an embodiment of the inventive concept. FIG. 4B is a cross-sectional view illustrating a portion of FIG. 4A. In FIG. 4B, an area, in which one light detection element PS of the configuration illustrated in the FIG. 4A is disposed, is illustrated as an example. Here, although not shown, the light sensing module 300 may further include a power supply module connected to a circuit part CL, or a circuit board connected to the circuit part CL.

Hereinafter, the light sensing module 300 will be described with reference to FIGS. 4A and 4B. As illustrated in FIG. 4A, the light sensing module 300 may include a base part BS, a circuit part CL, a plurality of light detection elements PS, an encapsulation part EC, and a lens part LS.

The base substrate BS may be an insulation substrate. The circuit part CL and the light detection elements PS are mounted over the base substrate BS. For example, the base substrate BS may be a silicon substrate, a glass substrate, or a plastic substrate.

The circuit part CL connects electrically the light detection elements PS to external electronic element that is not shown. The circuit part CL may supply external power to the light detection elements PS, control the operation of the light detection elements PS, and provide an electrical signal, which is generated by the light detection elements PS, to the outside.

The circuit part CL may include a thin film transistor TR and a plurality of insulation layers. The insulation layers may include a first insulation layer L1, a second insulation layer L2, and a third insulation layer L3 successively stacked on each other. Here, although not shown, the circuit part CL may further include signal lines connected to the thin film transistor TR and the light detection elements PS.

Thin film transistor TR is connected to the light detection element PS and provides an electrical signal to the light detection element PS. Thin film transistor TR controls the operation of the light detection element PS.

The thin film transistor TR includes a semiconductor pattern SM disposed on the base substrate BS, a control electrode CE that is spaced apart from and overlaps the semiconductor pattern SM while having the first insulation layer L1 therebetween, and input and output electrodes IE and OE that are spaced apart from each other and disposed between the second and third electrodes L2 and L3. Thin film transistor TR controls a charge movement of the semiconductor pattern SM through the control electrode CE, and outputs an electrical signal, which is inputted from the input electrode IE, via the output electrode OE.

Thin film transistor TR may have the configuration having substantially the same function as the thin film element TEM illustrated in FIG. 3. Hereinafter, duplicated descriptions with respect to the thin film transistor TR will be omitted.

The light detection element PS is connected to the thin film transistor TR. The light detection element PS may have various structures including a light detection layer PSL. For example, the light detection element PS includes the light detection layer PSL, and first and second light electrodes E1 and E2 which are spaced apart from each other while the light detection layer PSL is disposed therebetween.

The first light detection electrode E1 may be connected to the output electrode OE of the thin film transistor TR. The first light detection electrode E1 may receive an electrical signal from the thin film transistor TR.

The second light detection electrode E2 may be electrically conductive and transparent. For example, the second light detection electrode E2 may have a transparent conductive oxide. The light received by the light sensing module 300 may pass through the second light detection electrode E2 and then may be provided to the light detection layer PSL.

The second light detection electrode E2 may receive an electrical signal different from that of the first light detection electrode E1. The first and second light detection electrodes E1 and E2 are spaced apart from each other while the light detection layer PSL is disposed therebetween, and thus a predetermined electric field may be provided between the first and second light detection electrodes E1 and E2.

The light detection layer PSL generates an electrical signal by means of the incident light. The light detection layer PSL may absorb energy of the incident light and produce electric charges. For example, the light detection layer PSL may have a photosensitive semiconductor material.

The electric charges produced by the light detection layer PSL change the electric field between the first and second light detection electrodes E1 and E2. The amount of the electric charges produced by the light detection layer PSL is changed, depending on the amount and intensity of the light incident on the light detection element PS and whether the light is incident on the light detection element PS. Accordingly, the electric field generated between the first and second light detection electrodes E1 and E2 may change. The light detection element PS may obtain the fingerprint information of the user, using the change in electric field between the first and second light detection electrodes E1 and E2.

However, this is merely illustrated as an example, and the light detection element PS may include a thin film transistor in which the light detection layer PSL is used as an active layer. In this case, the light detection element PS may obtain the information of the fingerprint FNG by detecting an amount of current that flows through the thin film transistor. The light detection element PS according to an embodiment of the inventive concept may include various structures that may respond to the change in light quantity to generate an electrical signal, and is not limited to one embodiment.

The encapsulation part EC is disposed on the light detection element PS and protects the light detection element PS. The encapsulation part EC may have the insulation properties. For example, the encapsulation part EC may include at least one organic film and/or inorganic film. The encapsulation part EC prevents the light detection element PS from being affected by external moisture, pollution, or impact, thereby protecting the light detection element PS. However, this is merely illustrated as an example, and the encapsulation part EC may be omitted in the light sensing module 300 according to an embodiment of the inventive concept.

The lens part LS is disposed over the light detection element PS. The lens part LS improves the light collection properties of the light that is incident on the light sensing module 300. The lens part LS may be provided in the form of a single lens or a sheet with a plurality of light collection patterns. For example, the lens part LS may include a condensing lens or a condensing sheet such as a lenticular sheet or a prism sheet.

The lens part LS increases a ratio of the light incident on the light detection element PS with respect to the light incident on the light sensing module 300. The light sensing module 300 further includes the lens part LS, and thus may exhibit more improved optical sensitivity. However, this is merely illustrated as an example, and the lens part LS may be omitted in the light sensing module 300 according to an embodiment of the inventive concept.

Figure 5A:
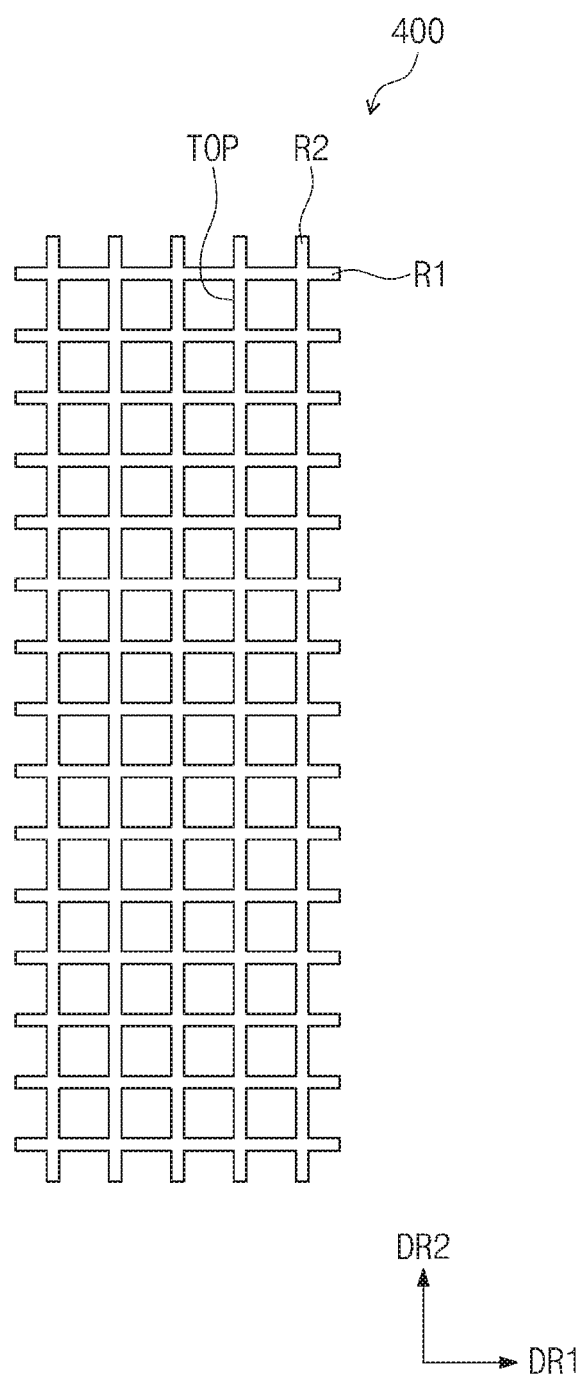
FIG. 5A is a plan view illustrating a lattice filter according to an embodiment of the inventive concept.
Figure 5B:
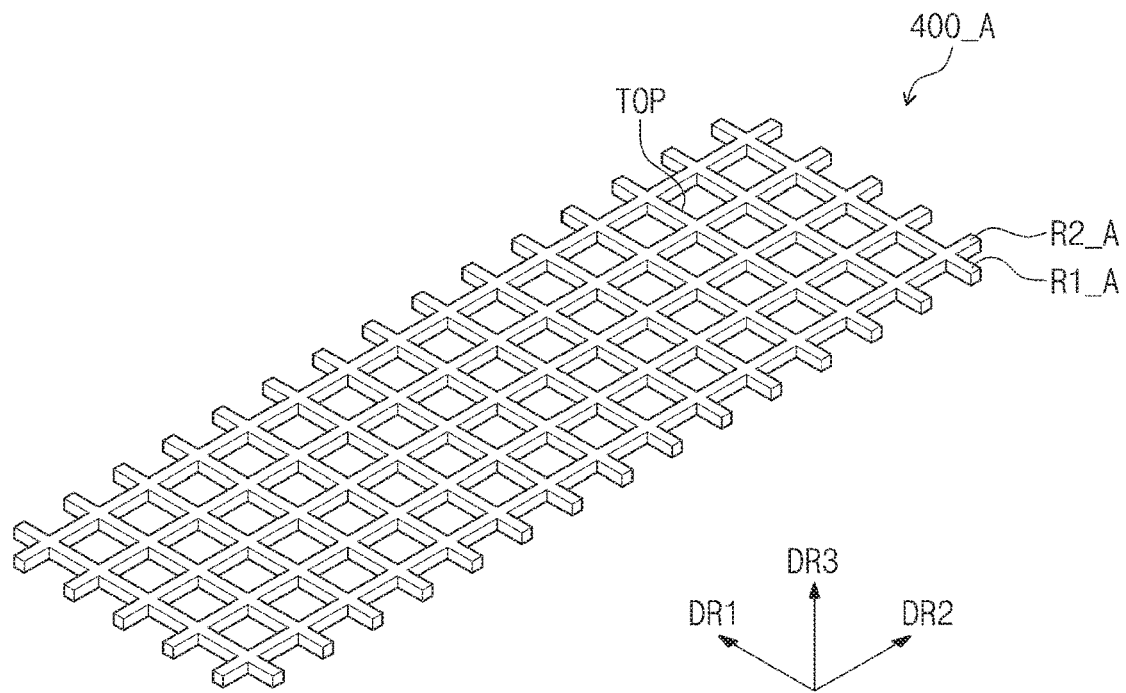
FIGS. 5B and 5C are perspective views of lattice filters according to embodiments of the inventive concept.
Figure 5C:
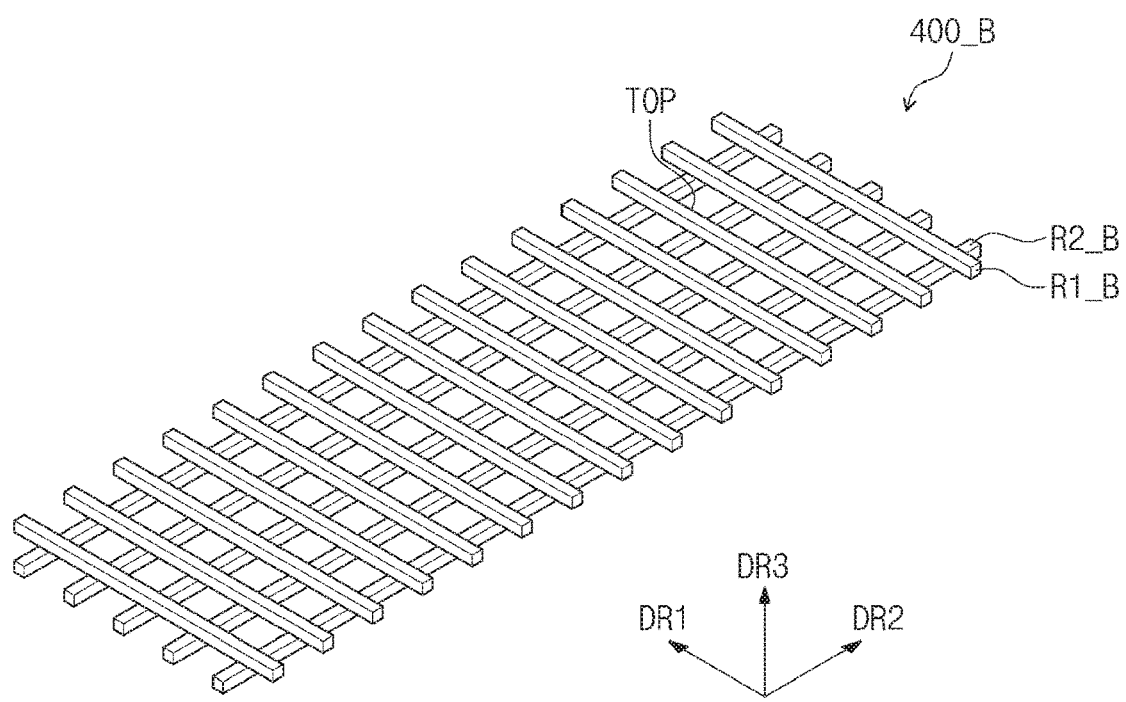

FIG. 5A is a plan view illustrating a lattice filter according to an embodiment of the inventive concept. FIGS. 5B and 5C are perspective views of lattice filters according to embodiments of the inventive concept. FIGS. 5B and 5C illustrate lattice filters 400_A and 400_B, respectively, which may have the same plan view as a lattice filter 400 illustrated in FIG. 5A. Hereinafter, the lattice filter 400 according to an embodiment of the inventive concept will be described with reference to FIGS. 5A to 5C.

As illustrated in FIG. 5A, the lattice filter 400 may include a plurality of light transmission parts TOP that are arranged in a matrix form in a first direction DR1 and a second direction DR2. The light transmission parts TOP may be defined by a plurality of line patterns. The line patterns include a plurality of first line patterns R1 and a plurality of second line patterns R2.

The first line patterns R1 are patterns arranged in the second direction DR2. Each of the first line patterns R1 has a straight line shape that extends in the first direction DR1. The first line patterns R1 and the second line patterns are arranged to form through-parts (e.g., holes) unoccupied by and defined by the first line patterns R1 or the second line patterns R2.

The second line patterns R2 are patterns that are arranged while being spaced apart from each other in the first direction DR1. Each of the second line patterns R2 has a straight line shape that extends in the second direction DR2.

The first line patterns R1 and the second line patterns R2 cross each other and are connected to each other. The first line patterns R1 and the second line patterns R2 are connected to each other in various manners, and thus may provide the light transmission parts TOP.

For example, as illustrated in FIG. 5B, the first line patterns R1 and the second line patterns R2 are connected to each other while providing the same layer, and may provide the lattice filter 400_A having an integrated shape. In this case, a thickness of the lattice filter 400_A may correspond to the greatest thickness among the thicknesses of the first line patterns R1 and the second line patterns R2, wherein the first line patterns R1, the second line patterns R2, and the light transmission parts TOP may be defined on the same layer.

Alternatively, for example, as illustrated in FIG. 5C, the first line patterns R1 and the second line patterns R2 are connected to each other while providing different layers, and may provide the lattice filter 400_B having an integrated shape. In this case, the light transmission parts TOP may be defined in a manner in which each of the first line patterns R1 and the second line patterns R2 is projected.

Accordingly, a thickness of the lattice filter 400_B may correspond to the sum of the thicknesses of the first line patterns R1 and the second line patterns R2, wherein the light transmission parts TOP may be defined on a layer different from those of the first line patterns R1 and the second line patterns R2.

In the current embodiment, the light transmission parts TOP are defined to penetrate the lattice filter 400 in a direction parallel to a third direction DR3. Therefore, the lattice filter 400 may filter the incident light into light that has an optical path parallel to the third direction DR3.

Also, in the current embodiment, each of the light transmission parts TOP is illustrated as a rectangular shape. However, this is merely illustrated as an example, and each of the light transmission parts TOP may have various shapes such as a circle, an oval, and a polygon, and an extension direction or a shape of each of the first line patterns R1 and the second line patterns R2 may be diversely designed.

The lattice filter 400 according to an embodiment of the inventive concept may have various shapes as long as it may define the light transmission parts TOP. The lattice filter 400 selectively transmits the light that passes through the light transmission parts TOP, and thus may provide the light, which has the uniform optical path, to the light sensing module 300 (see FIG. 2).

Figure 6:
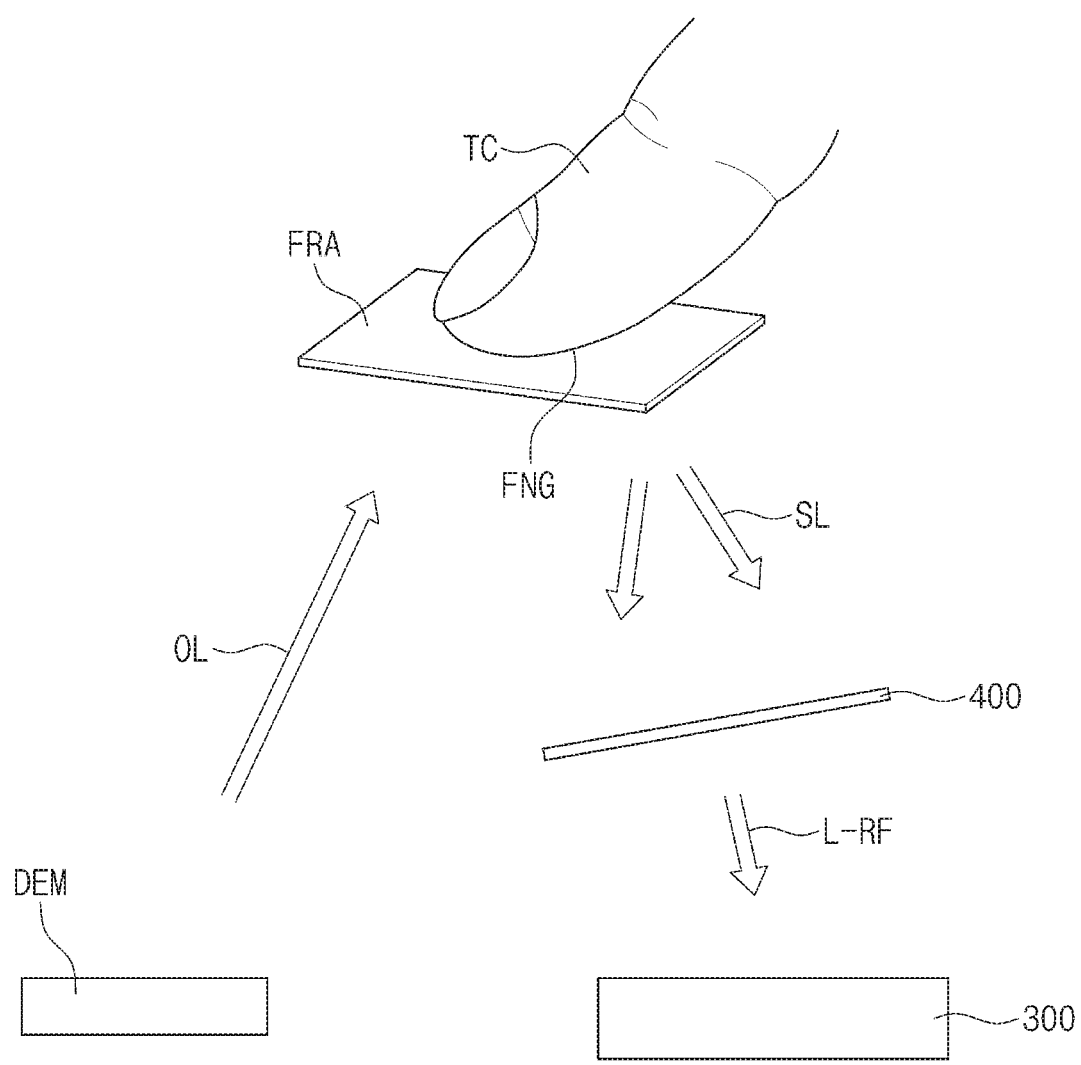
FIG. 6 is a schematic view illustrating a light detection flow of an electronic device according to an embodiment of the inventive concept.
Figure 7:
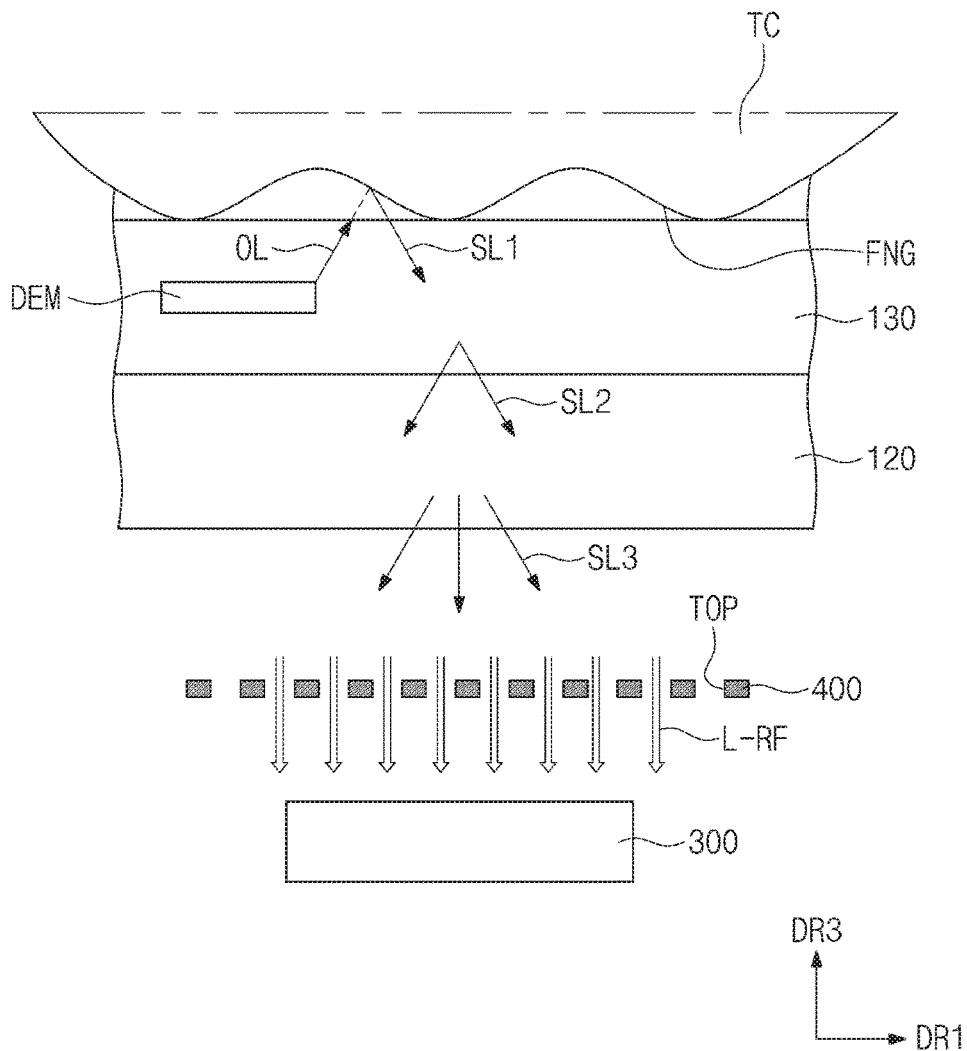
FIG. 7 is a schematic view illustrating a partial configuration illustrated in FIG. 6.

FIG. 6 is a schematic view illustrating a light detection flow of an electronic device according to an embodiment of the inventive concept. FIG. 7 is a schematic view illustrating a partial configuration illustrated in FIG. 6. FIG. 7 illustrates a light movement in a partial configuration illustrated in FIG. 6, and FIGS. 6 and 7 selectively and schematically illustrate a partial configuration of a partial electronic device for ease of description. Hereinafter, an embodiment of the inventive concept will be described with reference to FIGS. 6 to 7. Here, the same reference numeral may be given to components that are the same as those of FIGS. 1 to 5, and their duplicated descriptions will be omitted.

As illustrated in FIG. 6, when a fingerprint FNG is provided to a fingerprint detection area FRA, a display element DEM provides detection light OL to the fingerprint detection area FRA. The detection light OL may be light substantially discharged from at least one light emitting areas PXA (see FIG. 3).

The detection light OL may be light generated from the display element DEM so as to display an image IM, or light additionally generated from the display element DEM so as to detect the fingerprint FNG. According to an embodiment of the inventive concept, because the electronic device 1000 may use the display element DEM as a light source for the fingerprint detection, the fingerprint of the user may be easily detected while the image IM is not displayed or the image IM is displayed.

After the detection light OL is incident on the fingerprint FNG, a predetermined scatter light SL may be produced. The scatter light SL is light reflected from the fingerprint FNG, and thus may have information about the fingerprint FNG. Also, the scatter light SL may have light scattered from various components that constitutes the display panel 100 (see FIG. 2).

Referring to FIG. 7, the detection light OL may be incident on a touch TC provided from the outside of a display element 130. The detection light OL is incident on the touch TC, and then reflected from each point of the fingerprint FNG that is a surface of the touch TC, and thus a first scattered light SL1 is produced. The fingerprint FNG has a bent or curved surface. Depending on the incident point of the detection light OL with respect to the curved surface of the fingerprint FNG, reflective and scattered light may be generated in various paths. Accordingly, the first scattered light SL1 may have information about the fingerprint FNG.

Then, the first scattered light SL1 passes through the display element 130. In this case, a second scattered light SL2, which is discharged from the display element 130, may be produced. While passing through the display element 130, the first scattered light SL1 may be reflected or refracted by other display elements DEM, insulation layers that are not shown, or conductive patterns that are not shown, which constitute the display element 130. Therefore, the second scattered light SL2 may be light that has the path and intensity modified from those of the first scattered light SL1 by the display element 130.

Then, the second scattered light SL2 passes through an array part 120. In this case, a third scattered light SL3, which is discharged from the array part 120, may be produced. While passing through the array part 120, the second scattered light SL2 may be reflected or refracted by thin film elements, insulation layers, or signal lines that are not shown and constitute the array part 120. Therefore, the third scatter light SL3 may be light that has the path and intensity modified from those of the second scattered light SL2 by the array part 120.

Then, the third scattered light SL3 passes through a base substrate that is not shown, and is discharged to the outside of the display panel 100 (see FIG. 2), and then may be provided to the light sensing module 300. Although not shown, the third scattered light SL3 may be partially scattered while passing through the base substrate. However, because this effect may be the same as above, its duplicated description will be omitted.

Here, the third scattered light SL3 may be incident on a lattice filter 400 before reaching the light sensing module 300. The lattice filter 400 filters the third scattered light SL3, and provides controlled light L-RF to the light sensing module 300. The controlled light L-RF may be light incident on a front surface of the light sensing module 300, or light having an optical path parallel to a third direction DR3.

The lattice filter 400 selectively discharges the light, which passes through a light transmission part TOP, among the third scattered light SL3. Accordingly, the controlled light L-RF may have the light, which has the optical path parallel to the third direction DR3, and/or the light that passes through the light transmission part TOP and thus has the modified optical path parallel to the third direction DR3, among the third scattered light SL3.

The electronic device according to an embodiment of the inventive concept further includes the lattice filter 400, thereby improving the straightness of the light incident on the light sensing module 300. The light sensing module 300 receives the straightened light in the third direction DR3, and thus the quantity of light incident on an optical sensor PS (see FIG. 4) may increase. Also, the controlled light L-RF is incident uniformly and straight toward the lens part LS (see FIG. 4), and thus the collection efficiency of the lens part LS may be improved.

Also, the lattice filter 400 according to an embodiment of the inventive concept is disposed directly over a light incident surface of the light sensing module 300. Accordingly, even when the light with the information of the fingerprint FNG is reflected or refracted by the various component and is thus scattered before being incident on the light sensing module 300, the light with the information of the fingerprint FNG may be incident on the light sensing module 300 as the controlled light L-RF which has the straight and uniform optical path resulting from the lattice filter 400. Accordingly, even when the light sensing module 300 is provided to be separated from the display panel 100 and disposed on a rear surface of the display panel 100, the information of the fingerprint FNG may be easily detected such that the electronic device having the improved fingerprint sensitivity may be provided.

Figure 8:
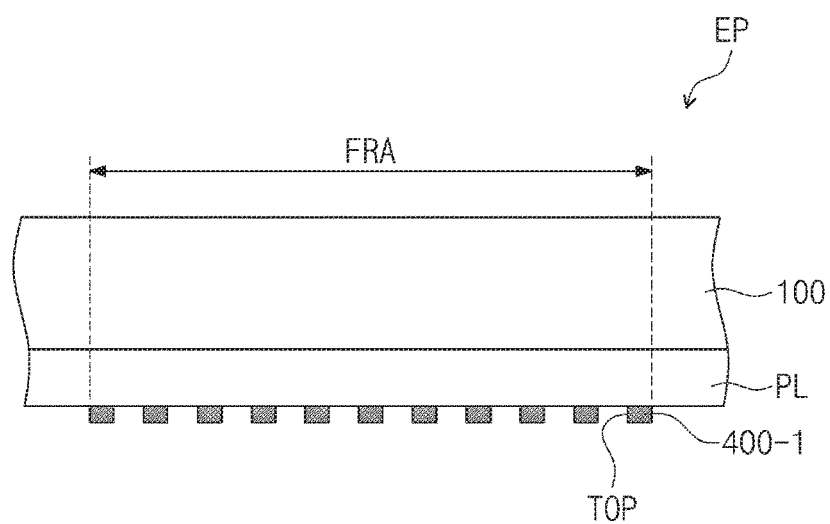
FIG. 8 is a cross-sectional view schematically illustrating a partial configuration of an electronic device according to an embodiment of the inventive concept.

FIG. 8 is a cross-sectional view schematically illustrating a partial configuration of an electronic device according to an embodiment of the inventive concept. FIG. 8 schematically illustrates a cross-section of an electronic panel EP that has a display panel 100 and a lattice filter 400-1, for ease of description. Hereinafter, an embodiment of the inventive concept will be described with reference to FIG. 8. Here, the same reference numeral may be given to components that are the same as those of FIGS. 1 to 7, and their redundant descriptions will be omitted.

As illustrated in FIG. 8, a protection layer PL is disposed on a rear surface of the display panel 100 and thus protects the display panel 100. The display layer PL may cover an entire surface of the rear surface of the display panel 100. The protection layer PL is disposed on the rear surface of the base substrate 110 (see FIG. 2).

The protection layer PL may have an organic material. The protection layer PL may directly contact the rear surface of the display panel 100, or may be coupled to the display panel 100 through an adhesive layer that is not shown.

The protection layer PL may have a transparently conductive material. Accordingly, light with the fingerprint information passes through the display panel 100 and the protection layer PL, and then may be discharged to the outside of the electronic panel EP.

The lattice filter 400-1 may be coupled to the protection layer PL. The lattice filter 400-1 may be provided directly on a rear surface of the protection layer PL. The lattice filter 400-1 may be closely attached to the protection layer PL. Accordingly, a portion of the light may be prevented from escaping through gap space between the display panel 100 and the lattice filter 400-1, and thus the optical sensitivity of a light detection sensor may be improved.

Figure 9A:
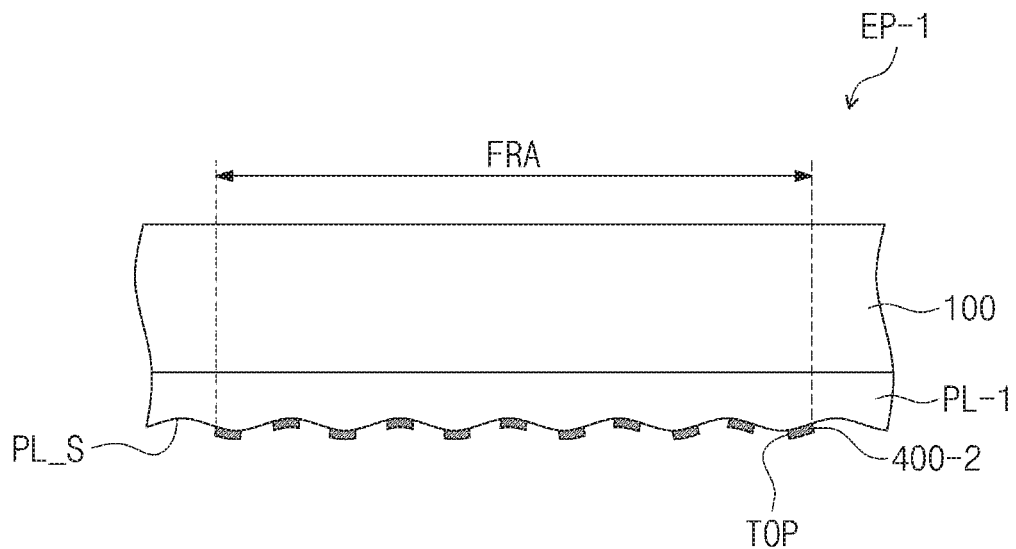
FIG. 9A is a cross-sectional view schematically illustrating a partial configuration of an electronic device according to an embodiment of the inventive concept.
Figure 9B:
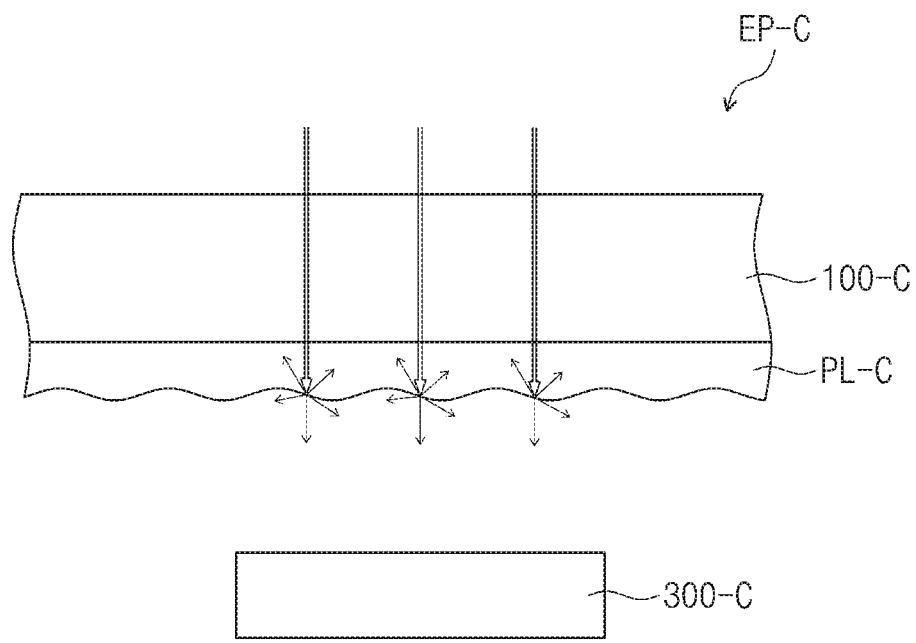
FIG. 9B is a cross-sectional view illustrating an optical path of a comparative example.

FIG. 9A is a cross-sectional view schematically illustrating a partial configuration of an electronic device according to an embodiment of the inventive concept. FIG. 9B is a cross-sectional view illustrating an optical path of a comparative example, and FIG. 9C is an optical path of the electronic device illustrated in FIG. 9A.

Figure 9C:
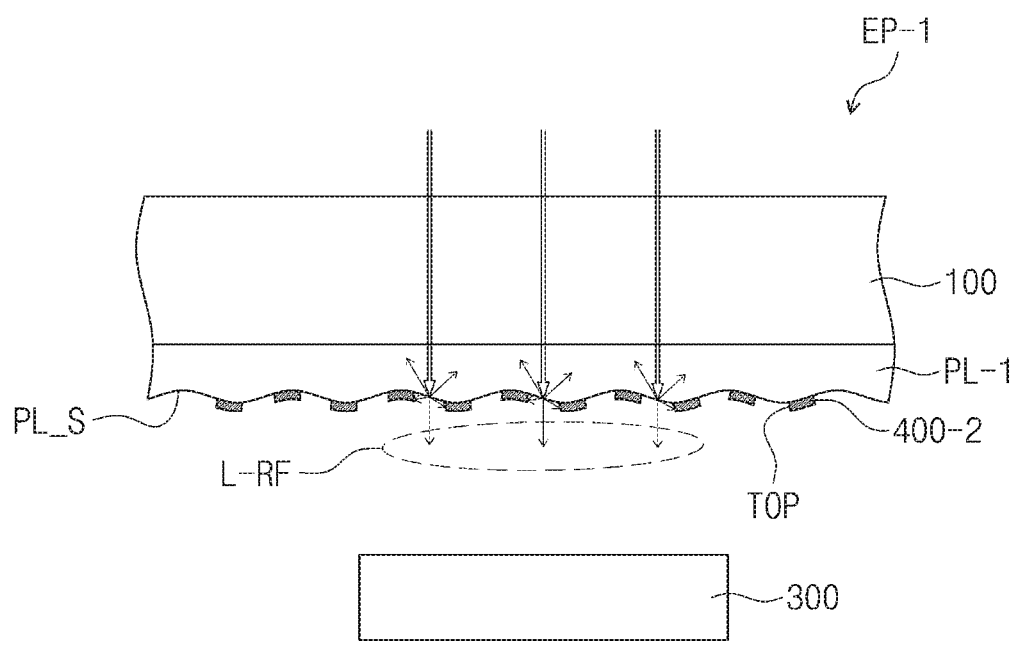
FIG. 9C is an optical path of the electronic device illustrated in FIG. 9A.

FIG. 9A illustrates a portion corresponding to FIG. 8, and FIG. 9C illustrates a state in which an optical path is added to FIG. 9A. In optical paths illustrated in FIGS. 9B and 9C, light with information of the fingerprint FNG (see FIG. 1) is indicated by a relatively thick arrow, and light scattered from surfaces of protection layers PL-C and PL-1 is indicated by a relatively thin arrow.

The comparative example (EP-C) of FIG. 9B is illustrated to include the same components as the embodiment of the inventive concept, except that a lattice filter 400-2 is omitted. That is, a display panel 100-C and the protection layer PL-C according to the comparative example (EP-C) may correspond to a display panel 100 and the protection layer PL-1 according to an embodiment of the inventive concept, respectively. Hereinafter, an embodiment of the inventive concept will be described with reference to FIGS. 9A to 9C.

As illustrated in FIG. 9A, an electronic panel EP-1 of the electronic device may have the protection layer PL-1 with an uneven surface PL_S. The rear surface PL_S may have a plurality of uneven portions. Accordingly, the rear surface PL_S may have a surface area relatively larger than that of the rear surface of the protection layer PL (see FIG. 8) illustrated in FIG. 8.

The protection layer PL-1 may have an organic material. The protection layer PL-1 may be provided by printing a liquid phase organic material on a rear surface of the panel EP. Here, the protection layer PL-1 may be provided through the screen print. Accordingly, the uneven rear surface PL_S may be provided.

The rear surface PL_S may have a plurality of uneven portions that constitute the uneven surface. The light incident on the rear surface PL_S through the display panel 100 may be scattered by the uneven portions. The rear surface PL_S provides the uneven surface, and thus may increase haze of the light which is radiated through the rear surface PL_S or incident again to the display panel 100. Therefore, it may prevent the light, which is incident again from the rear surface PL_S to the display panel 100, from being viewed on a front surface of the display panel 100 by the user.

The lattice filter 400-2 is disposed on the rear surface PL_S. Here, the lattice filter 400-2 has a relatively thin thickness and may be provided directly on the rear surface PL_S. Even when the lattice filter 400-2 is provided along the rear surface PL_S, the lattice filter 400-2 has the relatively thin thickness, and thus light transmission parts TOP may be stably provided. Therefore, the lattice filter 400-2 may be stably disposed even on the rear surface PL_S with an uneven surface condition.

Referring to FIGS. 9B and 9C, the light with the information of the fingerprint FNG is radiated from a display panel 100, and passes through the protection layer PL-1 before reaching a light sensing module 300. As described above, the flatness of the rear surface PL_S of the protection layer PL_1 affects the direction of incident light. In this case, the light with the information of fingerprint FNG may be also affected by the surface condition of the rear surface PL_S, and then scattered.

Referring to FIG. 9B, the comparative example that is illustrated does not include the lattice filter 400. Accordingly, light sensing module 300-C receives light that is scattered by the rear surface PL_S and thus has high haze. The light scattered by the rear surface PL_S is introduced to the light sensing module 300-C via various optical paths, or is not incident on the light sensing module 300-C, and thus a portion of the light may escape. The light sensing module 300-C may generate an electrical signal that has information different from the light with the information of the fingerprint FNG, and thus the sensitivity of the light sensing module 300-C may be deteriorated.

On the contrary, referring to FIG. 9C, the electronic panel EP-1 according to an embodiment of the inventive concept includes the lattice filter 400-2. Scattered light passes through the lattice filter 400-2 before reaching the light sensing module 300. The lattice filter 400-2 receives the scattered light and then discharges light L-RF having a controlled optical path. The light sensing module 300 may receive light that has information relatively similar to that of light radiated from the panel EP. Light L-RF having the controlled optical path is more likely to be incident on the light detection element PS, and thus the sensitivity of the light detection element 300 may be improved. Also, the light L-RF having the controlled optical path may be incident on the light sensing module 300 while having the uniform optical path in the fingerprint detection area FRA.

TABLE 1

|  | Light scattering properties (Haze) | | |
| --- | --- | --- | --- |
|  | Min. | Max. | Ave. |
| Comparative Example 1 | 72.9 | 73.24 | 73.01 |
| Comparative Example 2 | 54.95 | 55.91 | 55.27 |
| Embodiment | 65.7 | 67.09 | 66.49 |

Table 1 above shows the results in which the light scattering properties are evaluated with respect to the comparative example 1, the comparative example 2, and one embodiment of the inventive concept. The comparative example 1 relates to the comparative example (EP-C) illustrated in FIG. 9B, and the comparative example 2 relates to an example in which the lattice filter 400-2 and the protection layer PL-1 are removed, and the embodiment of the inventive concept relates to the electronic device EP-1 illustrated in FIG. 9C. In the embodiment of the inventive concept, the lattice filter 400-2 was evaluated with respect to the case which, for example, has the line patterns R1 and R2 (see FIG. 5A) with the width of about 475 μm and the light transmission parts TOP (see FIG. 5A) with the square shape having sides of about 200 μm. The light scattering properties (Haze) was represented by a minimum value (Min.), a maximum value (Max.), and an average value (Ave.).

As shown in Table 1, the embodiment (EP-1) of the inventive concept has the light scattering properties of about 66.49, which is lower than the light scattering properties of about 73.01 in the comparative example (EP-C). That is, it can be confirmed that the light scattering properties is reduced by further including the lattice filter 400-2.

Also, the comparative example 2 has the light scattering properties of about 55.27, which is lower than that of the embodiment (EP-1) of the inventive concept. This may be a result that the protection layer PL-1 is removed, and thus the light scattering properties due to the influence of the protection layer PL-1 itself is removed. However, when the protection layer PL-1 is removed, the light sensing module EP-1 may be easily viewed from the top surface of the electronic device EP-1. Therefore, the light sensing module 300 may be easily viewed from the fingerprint detection area FRA by the user, resulting in deterioration of the image visibility.

The electronic device EP-1 according to an embodiment of the inventive concept includes the protection layer PL-1 but may reduce the light scattering properties influenced by the protection layer PL-1, and thus may easily prevent the light sensing module 300 from being viewed from the outside and also may increase the quantity of light incident on the light sensing module 300. Therefore, the sensitivity of the light sensing module 300 may be improved.

Also, the lattice filter 400-2 according to an embodiment of the inventive concept may be easily disposed on the rear surface of the display panel 100-2 with the uneven surface. Accordingly, even when the light scattering properties increases depending on the surface condition of the rear surface of the electronic panel EP-1, the light sensing module 300 may stably receive the light with the controlled optical path such that the optical sensitivity of the light sensing module 300 may be uniformly maintained.

Figure 10A:
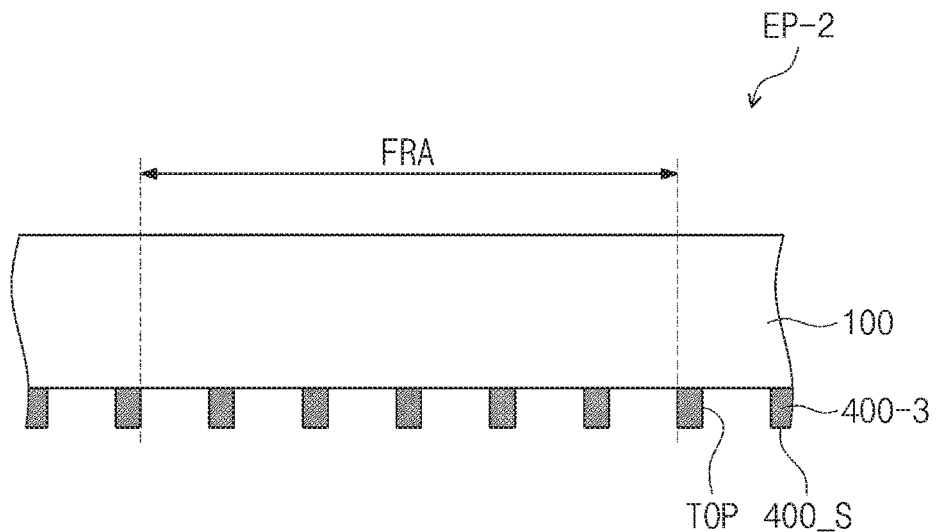
FIG. 10A is a cross-sectional view illustrating a portion of an electronic device according to an embodiment of the inventive concept.
Figure 10B:
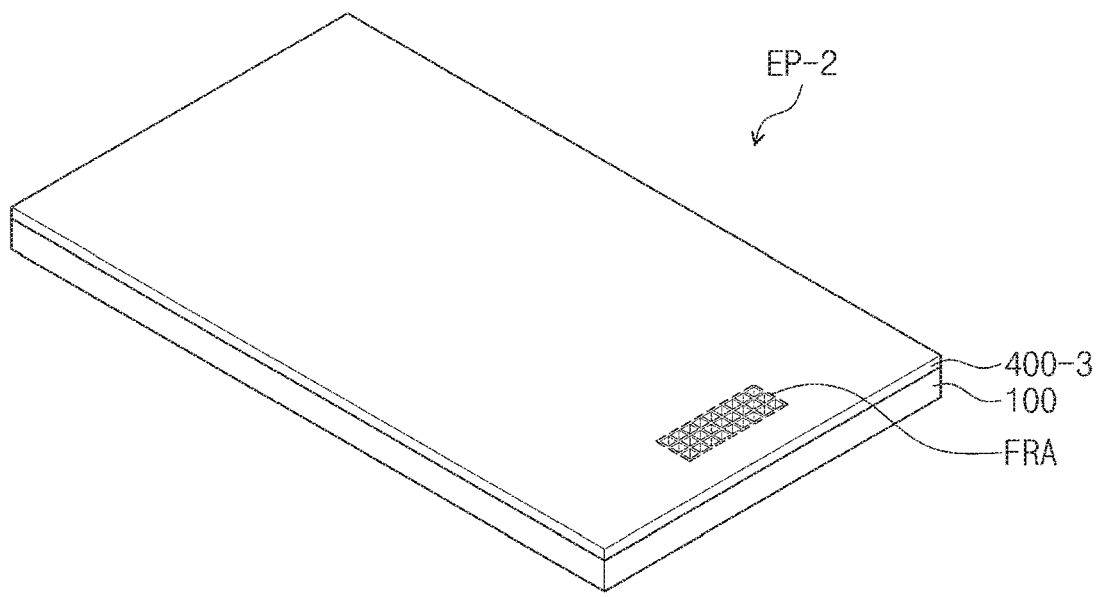
FIGS. 10B and 10C are perspective views schematically illustrating some configurations of an electronic device according to an embodiment of the inventive concept.
Figure 10C:
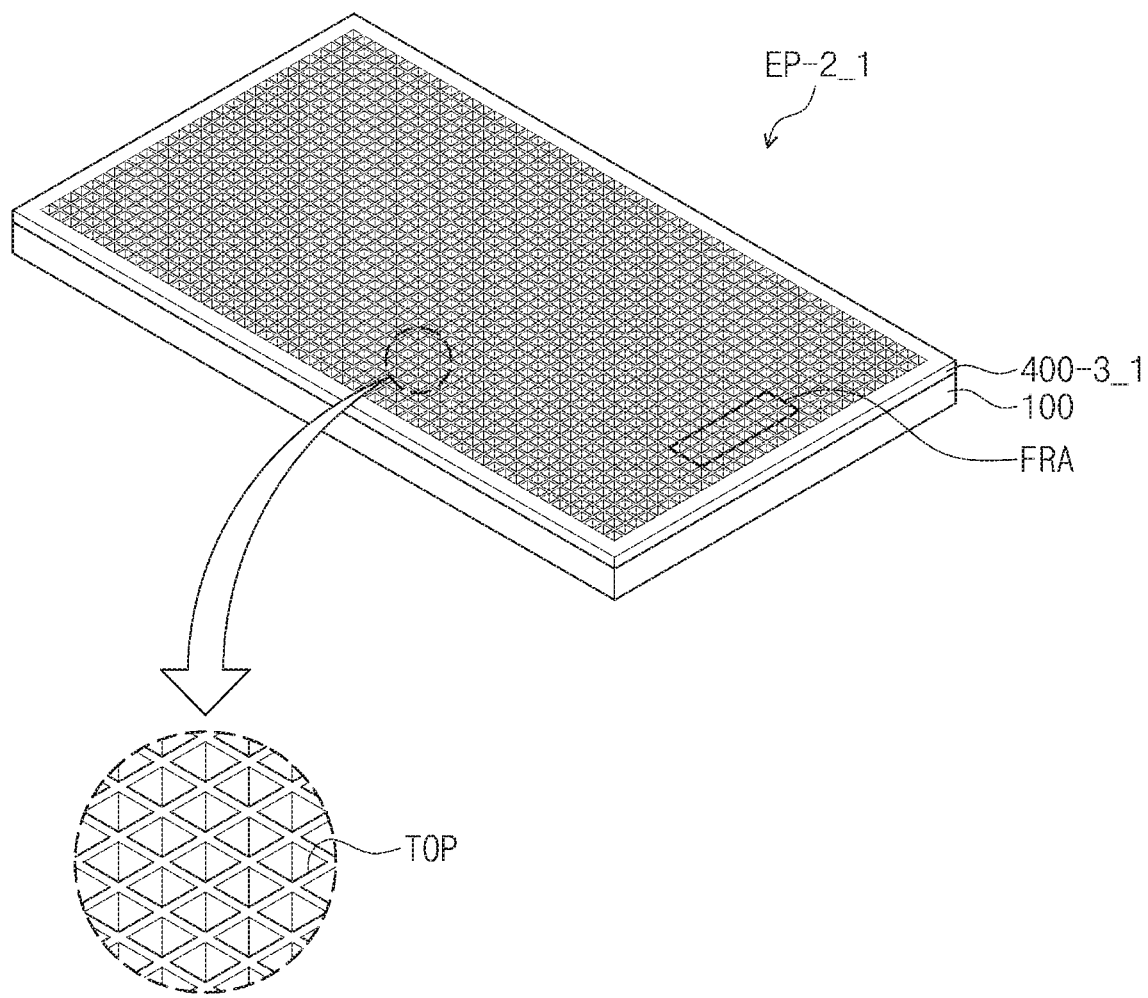

FIG. 10A is a cross-sectional view illustrating a portion of an electronic device according to an embodiment of the inventive concept. FIGS. 10B and 10C are perspective views schematically illustrating some configurations of an electronic device according to an embodiment of the inventive concept.

FIG. 10A illustrates a region that corresponds to FIG. 8 for ease of description, and FIG. 10B illustrates the perspective view of an electronic panel EP-2 when viewed from below, and FIG. 10C illustrates the perspective view of an electronic panel EP-2_1 corresponding to the electronic panel EP-2 of FIG. 10A when viewed from below. Hereinafter, an embodiment of the inventive concept will be described with reference to FIGS. 10A to 10C. Here, the same reference numerals may be given to components that are the same as those of FIGS. 1 to 9C, and their duplicated descriptions will be omitted.

As illustrated in FIGS. 10A and 10B, the electronic panel EP-2 includes a lattice filter 400-3 and a display panel 100. The lattice filter 400-3 may be disposed on a rear surface of the display panel 100 while overlapping the entire surface thereof. The lattice filter 400-3 entirely covers the rear surface of the display panel 100.

The lattice filter 400-3 may have an organic material. The lattice filter 400-3 may protect the display panel 100. In the current embodiment, the lattice filter 400-3 may have the same material as the protection layer PL illustrated in FIG. 8, and may replace the protection layer PL.

Here, although not shown, a rear surface 400-S of the lattice filter 400-3 may be an uneven surface. The rear surface 400-S of the lattice filter 400-3 may have a plurality of prominence and depression portions. Although the rear surface 400-S of the lattice filter 400-3 is not planar, shapes of light transmission parts TOP may be stably maintained. According to an embodiment of the inventive concept, as a protection layer having an uneven surface is used as the lattice filter 400-3, light, which has the stably and uniformly controlled optical path, may be provided to a light sensing module without being influenced by the uneven surface.

The light transmission parts TOP of the lattice filter 400-3 may be defined in only a partial area of the lattice filter 400-3. Therefore, the lattice filter 400-3 may include the light transmission parts TOP that are defined on the area corresponding to a fingerprint detection area FRA. The areas other than the fingerprint detection area FRA, among the rear surface of the display panel 100, may be covered by the lattice filter 400-3.

Alternatively, as illustrated in FIG. 10C, the electronic panel EP-2_1 may include a lattice filter 400-3_1 in which light transmission parts TOP are defined on an entire surface thereof. The lattice filter 400-3_1 may include the light transmission parts TOP that are defined to entirely overlap a rear surface of a display panel 100. The light transmission parts TOP may be arranged in a matrix form over the entirety of the lattice filter 400-3_1. The light transmission parts TOP include light transmission parts that overlap a fingerprint detection area FRA and light transmission parts that do not overlap the fingerprint detection area FRA.

Here, this is merely illustrated as an example. In the electronic panel EP-2_1, the fingerprint detection area FRA may be defined to overlap the front surface of the display area DA (see FIG. 2), and the light transmission parts TOP filters the light, which is incident through the front surface of the display area DA, and may provide the light to the light sensing module 300.

The electronic device according to an embodiment of the inventive concept may include the lattice filters 400-3 and 400-3_1 that may filter the light incident to the light sensing module and protect the display panel 100. According to an embodiment of the inventive concept, the lattice filter 400-3 and the protection layer may be integrated into one body.

Figure 11:
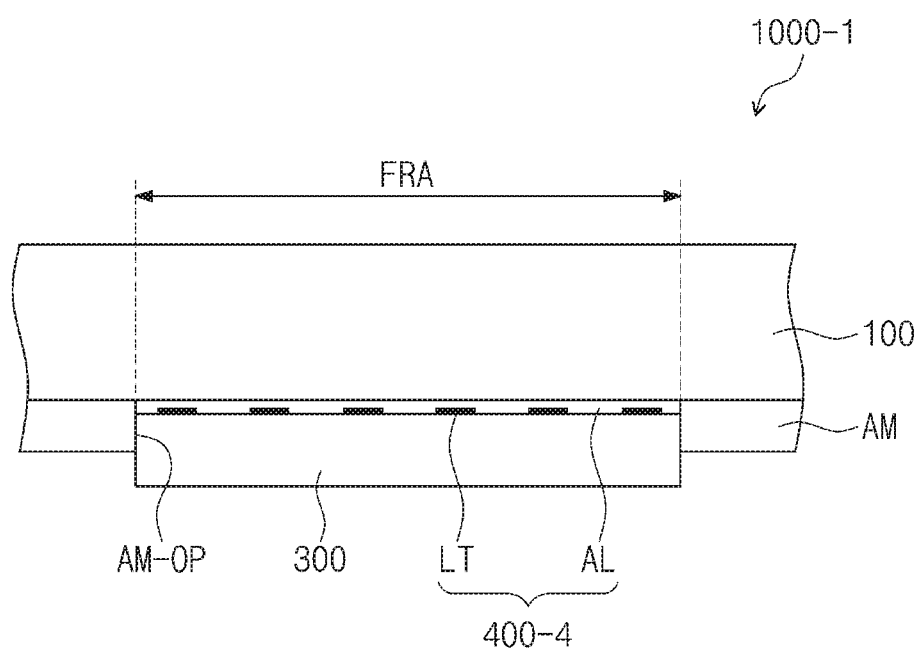
FIG. 11 is a cross-sectional view illustrating a portion of an electronic device according to an embodiment of the inventive concept.

FIG. 11 is a cross-sectional view illustrating a portion of an electronic device according to an embodiment of the inventive concept. FIG. 11 illustrates a region that corresponds to FIG. 8 for ease of description. Hereinafter, an embodiment of the inventive concept will be described with reference to FIG. 11. Here, the same reference numerals may be given to components that are the same as those of FIGS. 1 to 10C, and redundant descriptions will be omitted.

As illustrated in FIG. 11, an electronic device 1000-2 may further include a protection member AM. The protection member AM is disposed to a rear surface of a display panel 100 and protects the display panel 100. The protection member AM may have silicone, rubber, a sponge having a porous material, or the like.

Here, the protection member AM may have a predetermined opening AM-OP defined therein. A light sensing module 300 may be disposed in the opening AM-OP defined in the protection member AM. Therefore, the light sensing module 300 may stably receive light discharged from a display panel 100, without being influenced by the protection member AM.

As illustrated in FIG. 11, in the electronic device 1000-2, a lattice filter 400-4 may physically connect the display panel 100 and the light sensing module 300. The lattice filter 400-4 may have an adhesive part AL and a lattice part LT.

The adhesive part AL may contact both the light sensing module 300 and the display panel 100. The adhesive part AL may be transparent and may have the adhesion properties. For example, the adhesive part AL may include at least one of an optical clear adhesive (OCA), an optical clear resin (OCR), an optical transfer tape (OTT), or a pressure sensitive adhesive (PSA).

The lattice part LT is disposed in one side of the adhesive part AL. In the current embodiment, the lattice part LT is illustrated as disposed on a rear surface of the adhesive part AL and contacting the light sensing module 300. Here, the lattice part LT is located closest to the light sensing module 300, and thus light having an optical path controlled by the lattice filter 400-4 may be directly provided to the light sensing module 300.

However, this is merely illustrated as an example, and the lattice part LT may be disposed on a front surface of the adhesive part AL and contact the display panel 100, or may be inserted into the adhesive part AL and disposed spaced apart from the display panel 100 or the light sensing module 300. In this case, the coupling force between the lattice filter 400-4 and the light sensing module 300 may be improved. The lattice filter 400-4 according to an embodiment of the inventive concept may include the lattice part LT, and is not limited to one embodiment.

The lattice part LT may have an inorganic material. For example, the lattice part LT may be formed by depositing and printing the inorganic material, which has the high light-blocking properties, onto the adhesive part AL. Therefore, the lattice filter 400-4 may use the lattice part LT having the thickness as a relatively thin film, thereby stably filtering the light provided to the light sensing module 300.

The electronic device 1000-2 according to an embodiment of the inventive concept may stably fix the light sensing module 300 to the rear surface of the display panel 100, while achieving the optical path control through the lattice filter 400-4. According to an embodiment of the inventive concept, the manufacturing process of the electronic device 1000-2 may be simplified, and the processing costs may be reduced.

According to the embodiment of the inventive concept, the electronic panel detects the surface information about the input applied from the outside, and discharges the corresponding light to the rear surface thereof. In this case, the electronic panel may improve the straightness of light discharged to the rear surface thereof. Therefore, the electronic panel may provide the light having the controlled optical path, to the light sensing module disposed on the rear surface of the electronic panel, thereby improving the detection accuracy or sensitivity of the light sensing module.

Also, according to an embodiment of the inventive concept, even when the light scattering properties increases due to the surface condition of the rear surface of the display panel or the internal components of the display panel, the path of light incident on the light sensing module may be uniformly maintained.

Although described with reference to preferred embodiments of the present disclosure, it will be understood that various changes and modifications of the present disclosure can be made by one skilled in the art or one having ordinary knowledge in the art without departing from the spirit and technical field of the present disclosure as hereinafter claimed.

Hence, the technical scope of the present disclosure is not limited to the detailed descriptions in the specification, but it should be determined only by reference of the claims.

What is claimed is:

1. An electronic device comprising:
   a display panel having a front surface and a rear surface opposing the front surface, and comprising a plurality of light emitting areas each of which is disposed to emit light toward the front surface;
   a protection layer directly contacting the rear surface, the protection layer containing an organic material;
   a light sensing module disposed on the protection layer and comprising a light detection element; and
   a lattice filter disposed between the protection layer and the light sensing module, and comprising a plurality of light transmission parts spaced apart from one another on the rear surface, the light transmission part allowing light from the display panel to pass and reach the light sensing module,
   wherein the protection layer has a rear surface comprising a plurality of uneven portions when viewed in cross section, and the lattice filter is disposed along the uneven portions.

2. The electronic device of claim 1, wherein light incident on the light sensing module is incident through the light transmission parts.

3. The electronic device of claim 2, wherein the light incident on the light sensing module has an optical path controlled in a direction parallel to a thickness direction of the display panel.

4. The electronic device of claim 1, wherein the lattice filter has a light blocking material.

5. The electronic device of claim 1, wherein the lattice filter has silver (Ag).

6. The electronic device of claim 1, wherein the display panel has a fingerprint detection area which overlaps at least a portion of the light emitting areas and which detects a fingerprint of a user, and the light transmission parts of the lattice filter overlap the fingerprint detection area on a plane.

7. The electronic device of claim 6, wherein the lattice filter covers the entire rear surface of the display panel, and the light transmission parts are defined in a portion of the lattice filter.

8. The electronic device of claim 6, wherein the lattice filter covers the entire rear surface of the display panel, and the light transmission parts are defined over an entirety of the lattice filter.

9. The electronic device of claim 6, wherein the lattice filter has a rear surface that faces the light sensing module and has a plurality of uneven portions.

10. The electronic device of claim 1, wherein the lattice filter comprises:

an adhesive part that has an adhesive material; and a lattice part that contacts the adhesive part and comprises the light transmission parts defined therein.

11. The electronic device of claim 10, wherein the adhesive part contacts both the display panel and the light sensing module, and couples the display panel and the light sensing module.

12. The electronic device of claim 11, wherein the lattice part is disposed between the adhesive part and the light sensing module, and portions of the adhesive part contact the light sensing module through the light transmission parts.

13. The electronic device of claim 1, wherein the display member comprises:

an array part comprising a plurality of thin film elements; and a plurality of organic light emitting elements electrically connected to the array part and disposed in the respective light emitting areas.

14. The electronic device of claim 13, further comprising an input sensing part that is disposed on the display panel and detects a touch applied from the outside.

15. The electronic device of claim 1, wherein the light detection element comprises a first electrode, a second electrode facing the first electrode, and a light detection layer that is disposed between the first electrode and the second electrode and has a light reactive semiconductor material.

16. An electronic panel comprising:

a display panel having a front surface having a display area that displays an image and a peripheral area that is adjacent to the display area, and a rear surface opposing to the front surface, the display panel comprising a plurality of organic light emitting elements disposed in the display area;

a protection layer directly contacting the rear surface, the protection layer containing an organic material and having an uneven surface; and a lattice filter disposed on the uneven surface of the protection layer and comprising a plurality of through-parts arranged on the protection layer and spaced apart from each other in a matrix form, wherein the through-parts overlap at least a portion of the display area in a plan view.

17. The electronic panel of claim 16, wherein at least a portion of light emitted from the organic light emitting elements passes through the rear surface of the display panel and propagates through the through-parts.

18. The electronic panel of claim 16, wherein the lattice filter covers an entirety of the rear surface of the display panel.

19. The electronic panel of claim 18, wherein the lattice filter has an organic material.

20. The electronic panel of claim 18, wherein a rear surface of the lattice filter is an uneven surface.

21. The electronic panel of claim 16, wherein the rear surface of the display panel is an uneven surface having a plurality of uneven portions, and the lattice filter is disposed along the uneven portions.

* * * * *